(12) United States Patent
Su et al.

(10) Patent No.: US 9,055,670 B2
(45) Date of Patent: Jun. 9, 2015

(54) PORTABLE ELECTRONIC DEVICE AND BATTERY MODULE

(71) Applicant: Wistron Corporation, New Taipei (TW)

(72) Inventors: Chia-Cheng Su, New Taipei (TW);
Tsung-Hsien Chen, New Taipei (TW);
Po-Yuan Hsu, New Taipei (TW);
Hsing-Wang Chang, New Taipei (TW);
Wei-Cheng Wang, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 182 days.

(21) Appl. No.: 13/939,885

(22) Filed: Jul. 11, 2013

(65) Prior Publication Data

US 2014/0071600 A1 Mar. 13, 2014

(30) Foreign Application Priority Data

Sep. 12, 2012 (TW) .............................. 101217621 U

(51) Int. Cl.
| | |
|---|---|
| *G06F 1/16* | (2006.01) |
| *H01M 2/10* | (2006.01) |
| *H05K 7/02* | (2006.01) |
| *H04M 1/02* | (2006.01) |

(52) U.S. Cl.
CPC .............. *H05K 7/02* (2013.01); *H04M 1/0202* (2013.01); *G06F 1/1635* (2013.01); *H01M 2/1022* (2013.01)

(58) Field of Classification Search
USPC .................................. 361/679.55; 429/96–98
See application file for complete search history.

(56) References Cited

U.S. PATENT DOCUMENTS

| | | | | |
|---|---|---|---|---|
| 5,293,300 | A * | 3/1994 | Leung ...................... | 361/679.59 |
| 5,642,258 | A * | 6/1997 | Barrus et al. ............. | 361/679.59 |
| 5,719,799 | A * | 2/1998 | Isashi ............................. | 708/105 |
| 5,939,691 | A | 8/1999 | Shiau | |
| 6,191,941 | B1 * | 2/2001 | Ito et al. .................... | 361/679.27 |
| 6,385,039 | B1 * | 5/2002 | Chiang et al. ............ | 361/679.09 |
| 6,385,041 | B1 * | 5/2002 | Choi ....................... | 361/679.41 |
| 6,452,795 | B1 * | 9/2002 | Lee .......................... | 361/679.41 |
| 6,491,409 | B1 * | 12/2002 | Sharrah et al. ............... | 362/206 |
| 6,768,637 | B1 * | 7/2004 | Amemiya ................ | 361/679.55 |
| 6,894,893 | B2 * | 5/2005 | Hidesawa ................ | 361/679.55 |
| 7,167,358 | B2 * | 1/2007 | Iwasaki et al. ........... | 361/679.21 |
| 7,489,507 | B2 * | 2/2009 | Karashima et al. ...... | 361/679.28 |
| 7,502,222 | B2 * | 3/2009 | Cheng et al. ............. | 361/679.55 |

(Continued)

*Primary Examiner* — Adrian S Wilson
(74) *Attorney, Agent, or Firm* — Muncy, Geissler, Olds & Lowe, P.C.

(57) ABSTRACT

A battery module comprises a case, an extension/retraction positioning module, a press element, a battery body and a cap. The extension/retraction positioning module is disposed in the case to enable an extension/retraction operation along a first axis; the press element is connected with the extension/retraction positioning module to drive the extension/retraction positioning module to enable the extension/retraction operation when the press element is pushed; the battery body is disposed in the case to move relative to the case to an initial position or a power supply position by the extension/retraction operation, the battery body comprises a power connecting portion; the cap combines with the case and the portable electronic device in a rotational manner. The battery body moves to the initial position or the power supply position by the extension/retraction operation to determine whether the power connecting portion is electrically connected with the portable electronic device.

20 Claims, 8 Drawing Sheets

(56) References Cited

U.S. PATENT DOCUMENTS

| | | | |
|---|---|---|---|
| D603,330 S * | 11/2009 | Iseki | D13/103 |
| D621,829 S * | 8/2010 | Cheng | D14/327 |
| 8,253,601 B2 * | 8/2012 | Yuan | 341/22 |
| 8,289,686 B2 * | 10/2012 | Yang et al. | 361/679.27 |
| 8,295,039 B2 * | 10/2012 | Cheng et al. | 361/679.26 |
| 8,382,312 B2 * | 2/2013 | Crawford et al. | 362/203 |
| 2004/0246670 A1 * | 12/2004 | Lai | 361/683 |
| 2006/0133021 A1 * | 6/2006 | Fan | 361/683 |
| 2011/0122556 A1 * | 5/2011 | Cheng et al. | 361/679.01 |
| 2013/0164591 A1 * | 6/2013 | Su et al. | 429/100 |

\* cited by examiner

PORTABLE ELECTRONIC DEVICE AND BATTERY MODULE

BACKGROUND OF THE INVENTION

1. Field of the Invention

The present invention relates to a battery module, and more particularly, to an exchangeable battery module for a portable electronic device.

2. Description of the Related Art

In general, a portable electronic device such as notebook PC, smart phone, or tablet PC is designed to have its battery module and accommodating space at the bottom of the portable electronic device to dispose easily the display module and other functional modules at the top of the portable electronic device. The portable electronic device usually uses a detachable battery cover to dispose and secure the battery module within the device, thereby preventing the battery module from detaching from the device body. Therefore, when a user wants to replace the battery module of the portable electronic device, he/she needs to flip the device upside down to open the battery cover, making it inconvenient for the user.

Besides, since users would often carry portable electronic devices with them, it is critical for the portable electronic devices to be dust/water-proof in their structures. If the portable electronic device is infiltrated with water and the battery module gets wet, it could affect internal system operations, causing short circuit inside the device and even leading to system malfunction or breakdown.

Therefore, it is necessary to provide a battery module which is replaceable and also dust/water-proof.

SUMMARY OF THE INVENTION

It is an object of the present invention to provide a battery module which is exchangeable for a portable electronic device.

It is another object of the present invention to provide a portable electronic device comprising the battery module.

In order to achieve the above object, the present invention discloses a battery module comprising a case, an extension/retraction positioning module, a press element, a battery body, an elastic element, and cap. The extension/retraction positioning module is disposed in the case to enable an extension/retraction operation along a first axis; the press element is connected with the extension/retraction positioning module and penetrates through the case, wherein the press element drives the extension/retraction positioning module to enable the extension/retraction operation when the press element is pushed; the battery body is disposed in the case to move relative to the case to an initial position or a power supply position by means of the extension/retraction operation, wherein the battery body comprises a first end connected with the extension/retraction positioning module, a second end and a power connecting portion disposed at the second end; the elastic element comprises two ends connected with the battery body and the case respectively; the cap combines with the case and the portable electronic device in a rotational manner. When the battery body is at the initial position, the battery body is not electrically connected with the portable electronic device; when the battery body moves to the power supply position by means of the extension/retraction operation, the battery body is electrically connected with the portable electronic device.

In an embodiment of the present invention, the battery module further comprises a first elastic isolation element, and the press element comprises a first ring-shaped recess for fixing the first elastic isolation element to ensure dust/water-proof between the press element and the case.

In an embodiment of the present invention, the case comprises a fixing portion and a through hole penetrating through the fixing portion along the first axis, the cap comprises a shaft hole for the fixing portion of the case to go through the shaft hole, and the press element penetrates through the fixing portion via the through hole. The cap comprises an embedded portion and an exposed portion, the embedded portion and the exposed portion are both hollow cylindrical structures centered around the first axis, the exposed portion having an outer diameter larger than that of the embedded portion; the shaft hole comprises a first shaft hole disposed at the exposed portion and a second shaft hole disposed at the embedded portion, the first shaft hole having a diameter larger than that of the second shaft hole; the embedded portion comprises an external thread structure disposed at an outer surface of the embedded portion and an inner thread structure disposed at an inner surface of the embedded portion facing the second shaft hole.

In an embodiment of the present invention, the fixing portion comprises a first fixing portion and a second fixing portion, the first fixing portion and the second fixing portion are both hollow cylindrical structures centered around the first axis, the first fixing portion having a outer diameter larger than that of the second fixing portion, the outer diameter of the first fixing portion corresponding to the diameter of the first shaft hole of the cap, and the outer diameter of the second fixing portion corresponding to the diameter of the second shaft hole of the cap; an outer surface of the second fixing portion comprises a thread structure corresponding to the inner thread structure.

In an embodiment of the present invention, the battery module further comprises a second elastic isolation element, and the exposed portion comprises a second ring-shaped recess for fixing the second elastic isolation element to ensure dust/water-proof between the cap and the portable electronic device.

In an embodiment of the present invention, the battery module further comprises a third elastic isolation element, and the case further comprises an extended portion and a connecting portion; the connecting portion is connected with the extended portion and the fixing portion respectively, and the through hole penetrates through the connecting portion and the fixing portion; the extended portion comprises a ring-shaped protruding portion, the connecting portion comprises a third ring-shaped recess corresponding to the ring-shaped protruding portion, and the elastic isolation element is disposed between the third ring-shaped recess and the ring-shaped protruding portion to ensure dust/water-proof between the extended portion and the connecting portion.

The present invention discloses a portable electronic device comprising a device body, a power receiving portion, and the battery module. The device body comprises a receiving pit; the power receiving portion is combined with the receiving pit to be electrically connected with the battery module; the battery module is detachably inserted in the receiving pit.

In an embodiment of the present invention, the device body further comprises a holding hole disposed at an off-center position, so as to form a handle portion between the holding hole and one side of the device body; and the receiving pit is disposed at the handle portion.

Accordingly, the battery module of the present invention can be inserted into or removed from the portable electronic device directly. The present invention also uses a cap to secure the battery module and to simplify the detaching procedures for the battery module. Since adopting the extension/retraction structure resembling that of a ball point pen, the present invention can control the electrical connection between the battery module and the portable electronic device simply by pushing the press element and achieve dust/water proof to enhance the convenience and safety in using the battery module.

DETAILED DESCRIPTION OF THE PREFERRED EMBODIMENT

The advantages and innovative features of the invention will become more apparent from the following detailed description when taken in conjunction with the accompanying drawings.

Figure 1:
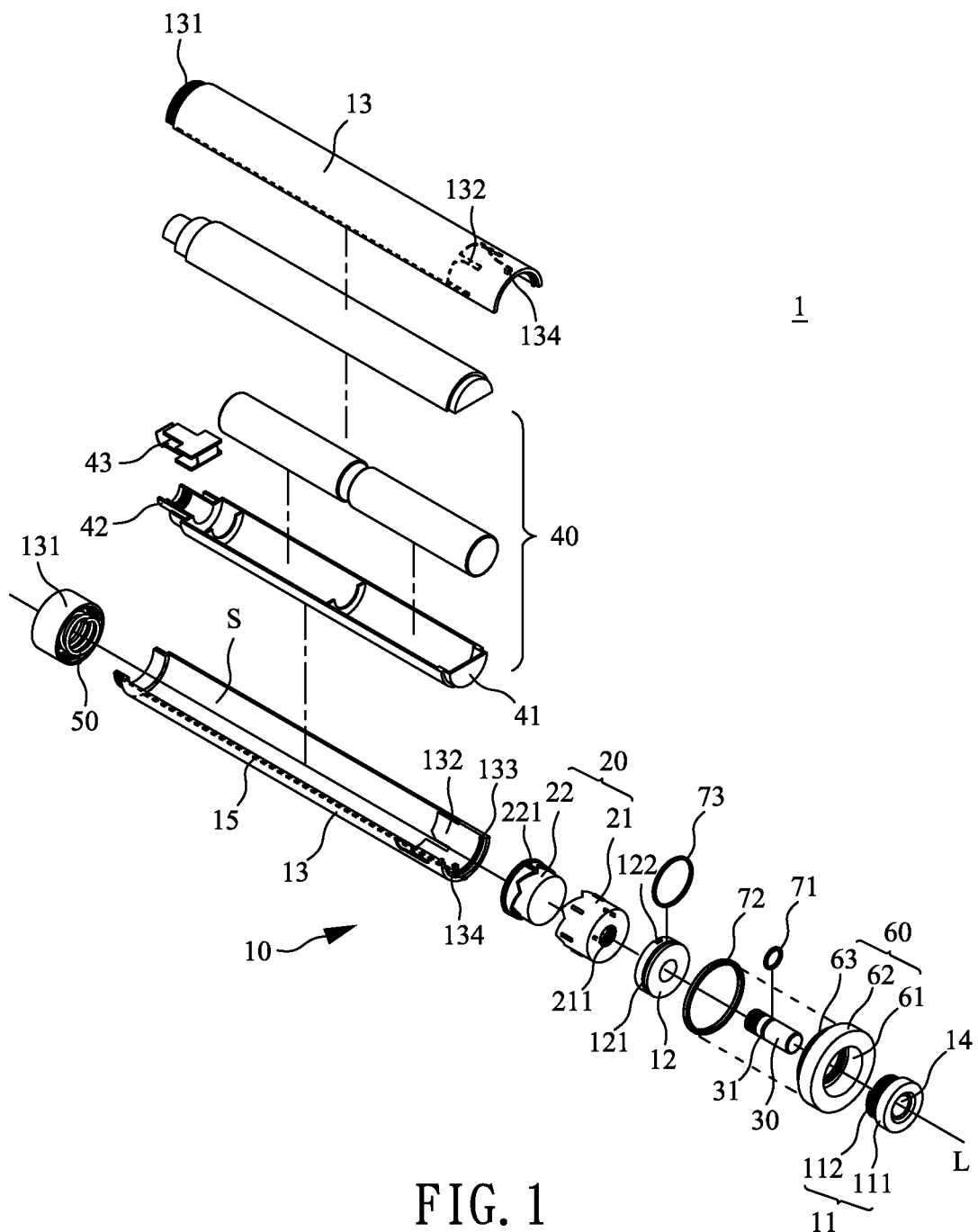
FIG. 1 illustrates an explosive view of a battery module of the present invention.
Figure 2:
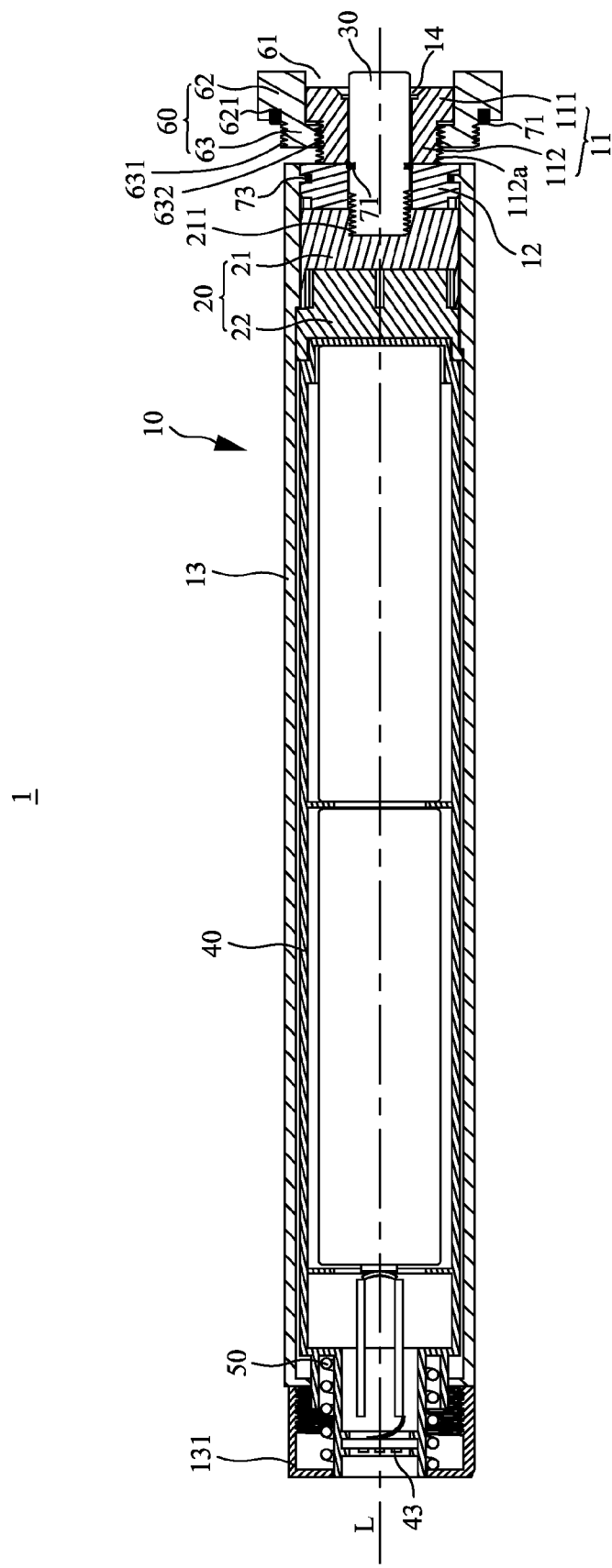
FIG. 2 illustrates a sectional view of the battery module in combination.

Please refer to both FIG. 1 and FIG. 2. FIG. 1 illustrates an explosive view of a battery module of the present invention; FIG. 2 illustrates a sectional view of the battery module in combination.

As shown in FIG. 1 and FIG. 2, the battery module 1 comprises a case 10, an extension/retraction positioning module 20, a press element 30, a battery body 40, elastic element 50, and a cap 60. The battery module 1 is designed as a column structure to conveniently inserted in the portable electronic device (not shown). In this embodiment, the case 10 comprises a cylindrical structure and extends in a first axis L, which is an central axis of the cylindrical structure; however, case 10 can comprises column structures formed in other shapes.

The case 10 comprises a fixing portion 11, a connecting portion 12, and an extended portion 13. The connecting portion 12 is connected with the fixing portion 11 and the extended portion 13 respectively. The fixing portion 11 is disposed at one side of the connecting portion 12, and the extended portion 13 extends towards the other side of the connecting portion 12 (the side opposite to the one where the fixing portion 11 is disposed) and forms an opening end 131 at an end of the extended portion 13. Besides, the case 10 further comprises a through hole 14. The through hole 14 penetrates through the fixing portion 11 and the connecting portion 12 along the first axis L, and the through hole 14 has a diameter about the same as a cross-sectional diameter of the press element 30, thereby allowing the press element 30 to pass through the through hole 14. The fixing portion 11 is combined with the cap 60; the extended portion 13 forms an accommodating space S for disposing the extension/retraction positioning module 20, the battery body 40, and the elastic element 50.

The extension/retraction positioning module 20 is disposed in the case 10 and comprises a first active element 21 and a second active element 22. A corresponding active structure 132 is disposed on an inner surface of the extended portion 13 of the case 10 and corresponds to a disposal position of the extension/retraction positioning module 20. The first active element 21 can move relative to the case 10 along the first axis L to push the second active element 22. The second active element 22 comprises a plurality of locking portions 221; when the second active element 22 is pushed by the first active element 21 to rotate around the first axis L relative to the case 10, the extension/retraction positioning module 20 can perform an extension/retraction operation along the first axis L relative to the case 10 by using the plurality of locking portions 221 to cooperate with the corresponding active structure 132 (in the mean time the first active element 21 and the second active element 22 lean against each other to operate). Since the extension/retraction positioning module 20 adopts an extension/retraction structure similar to that of a propelling ball pen, its operation and structure will not be further described. The first active element 21 comprises a fixing hole 211 for connecting and fixing the press element 30; in this embodiment, the fixing hole 211 and the press element 30 are fixed to each other by screw means; but they can be fixed with other fastening means. The second active element 22 is connected with the battery body 40 to let the battery body 40 move according to the extension/retraction operation of the extension/retraction positioning module 20.

One end of the press element 30 is connected with the first active element 21 of the extension/retraction positioning module 20, and the press element 30 penetrates through the fixing portion 11 and the connecting portion 12 via the through hole 14, so that another end of the press element 30 protrudes and exposes out of the case 10 for pushing manually. When an user pushes the press element 30, the extension/retraction positioning module 20 performs the extension/retraction operation according to the force applied on the press element 30.

The battery body 40 is disposed in the extended portion 13 of the case 10, the battery body 40 comprises a first end 41, a second end 42 opposite to the first end 41, and a power connecting portion 43. The first end 41 is connected with the second active element 22 of the extension/retraction positioning module 20, and the power connecting portion 43 is disposed at the second end 42 and comprises a plurality of power supply pins for outputting power from the battery body 40. The battery body 40 can, based on the extension/retraction operation of the extension/retraction positioning module 20, move to an initial position (shown in FIG. 7) or a power supply position (shown in FIG. 8) relative to the case 10. In this embodiment, when the battery body 40 is at the initial position, the battery body 40 is disposed completely in the case 10; when the battery body 40 moves to the power supply position, the power connecting portion 43 of the second end 42 goes through the opening end 131 of the extended portion 13 to protrude out of the case 10, so that the power connecting portion 43 is connected electrically with the portable electronic device to supply power. However, there can be other connecting means to supply power.

The elastic element 50 is disposed in the case 10, and the elastic element 50 comprises two ends connected with the second end 42 of the battery body 40 and the inner surface of the opening end 131 of the extended portion 13 of the case 10 respectively, so the elastic element 50 can provide an elastic force along the first axis L. In this embodiment, the elastic element 50 comprises a compression spring to cooperate with the extension/retraction operation of the extension/retraction positioning module 20 to provide the elastic restoring force to push the battery body 40 from the power supply position back to the initial position.

A cap 60 combines with the case 10 and the portable electronic device in a rotational manner. In this embodiment, the cap 60 comprises a shaft hole 61, an exposed portion 62 and an embedded portion 63, and the exposed portion 62 and the embedded portion 63 are mutually connected with each other. The exposed portion 62 and the embedded portion 63 are hollow cylindrical structures centered around the the first axis L; the shaft hole 61 penetrates through the exposed portion 62 and the embedded portion 63 along the first axis L, and the exposed portion 62 comprises an outer diameter larger than that of the embedded portion 63. The shaft hole 61 comprises a first shaft hole 611 and a second shaft hole 612, wherein the first shaft hole 611 is substantially positioned at the center of the exposed portion 62, and the second shaft hole 612 is substantially positioned at the center of the embedded portion 63; the first shaft hole 611 comprises a diameter larger than that of the second shaft hole 612. The embedded portion 63 comprises an external thread structure 631 disposed at an outer surface of the embedded portion 63 and an inner thread structure 632 disposed at an inner surface of the embedded portion 63 facing the second shaft hole 612. The external thread structure 631 serves as a fixing means to the portable electronic device, while the inner thread structure 632 serves as a fixing means to the fixing portion 11 of the case 10.

As to the design of the cap 60, in this ebodiment, the fixing portion 11 comprises a first fixing portion 111 and a second fixing portion 112 mutually connected with each other, and the first fixing portion 111 and a second fixing portion 112 are hollow cylindrical structures centered around the the first axis L. The through hole 14 penetrates through the first fixing portion 111 and the second fixing portion 112 along the first axis L, and the first fixing portion 111 comprises an outer diameter larger than that of the second fixing portion 112. The outer diameter of the first fixing portion 111 corresponds to the diameter of the first shaft hole 611 of the cap 60, thereby allowing the first fixing portion 111 to be disposed in the first shaft hole 611; the outer diameter of the second fixing portion 112 corresponds to the diameter of the second shaft hole 612 of the cap 60, thereby allowing the second fixing portion 112 to be disposed in the second shaft hole 612. An outer surface of the second fixing portion 112 comprises a thread structure 112a, wherein the thread structure 112a corresponds to the inner thread structure 632 of the embedded portion 63 of the cap 60 for fixing the second fixing portion 112. Therefore, the shaft hole 61 of the cap 60 is provided for disposing the fixing portion 11 of the case 10. The cap 60 is screwed to the thread structure 112a of the second fixing portion 112 of the case 10 by means of the inner thread structure 632 of the embedded portion 63, and the cap 60 is able to rotate around the first axis L relative to the the case 10.

Besides, the battery module 1 of the present invention is disposed with elastic isolation elements at gaps which might be formed between components to provide dust/water-proof effects. In this embodiment, the elastic isolation elements are elastic rings made of plastic material, or they can be made with other suitable type of materials.

As showing in FIG. 1 and FIG. 2, the battery module 1 further comprises a first elastic isolation element 71, and the press element 30 comprises a first ring-shaped recess 31. The first elastic isolation element 71 fixed on the first ring-shaped recess 31 can contact with the press element 30 and the case 10 simultaneously for filling the gap which might be formed between the press element 30 and the case 10 to ensure dust/water-proof therebetween.

The battery module 1 further comprises a second elastic isolation element 72, and the exposed portion 62 of the cap 60 comprises a second ring-shaped recess 621. When the cap 60 is fixed to the portable electronic device, the surface of the cap 60 disposed the second ring-shaped recess 621 is in contact with the portable electronic device; therefore, the elastic isolation element 72 fixed to the second ring-shaped recess 621 can contact with the cap 60 and the portable electronic device simultaneously for filling the gap which might be formed between the cap 60 and the portable electronic device to ensure dust/water-proof therebetween.

In this embodiment, the connecting portion 12 and the extended portion 13 of the case 10 are independent elements, there might be a gap between the connecting portion 12 and the extended portion 13; therefore, the battery module 1 further comprises a third elastic isolation element 73, the extended portion 13 of the case 10 comprises a ring-shaped protruding portion 133, and the connecting portion 12 comprises a third ring-shaped recess 121 corresponding to the ring-shaped protruding portion 133. The third elastic isolation element 73 is fixed to the third ring-shaped recess 121. When the ring-shaped protruding portion 133 of the extended portion 13 is disposed in the third ring-shaped recess 121 of the connecting portion 12, the third elastic isolation element 73 is positioned between the ring-shaped protruding portion 133 and the third ring-shaped recess 121 to fill the gap between the extended portion 13 and the connecting portion 131 to ensure dust/water-proof therebetween.

In order to prevent the battery body 40 from rotating around the case 10 and to keep the pin positions of the power connecting portion 43 in place to provide good power connectivity to the portable electronic device, the extended portion 13 of the battery module 1 further comprises at least one restraining structure 134, and the connecting portion 12 further comprises at least one corresponding restraining structure 122. The at least one restraining structure 134 corresponds to the at least one corresponding restraining structure 122 in its structural form, position and quantity. Each restraining structure 134 is linked with each corresponding restraining structure 122 to limit the extended portion 13 to rotate relative to the connecting portion 12.

The above embodiment is simply one of the aspects of the present invention. In another embodiment of the present invention, the connecting portion 12 and the extended portion 13 of the case 10 can be formed in one piece, even the fixing portion 11, the connecting portion 12, and the extended portion 13 of the case 10 can be formed into a unitary structure to eliminate the need for disposing the third elastic isolation element 73 between the connecting portion 12 and the extended portion 13. Furthermore, each restraining structure 134 and each corresponding restraining structure 122 can be omitted to simplify the assembly process and structural design of the battery module 1.

Besides, the case 10 of the battery module 1 further comprises at least one guiding portion 15. Each guiding portion 15 is disposed on an outer surface of the case 10 to cooperate with the corresponding structural design of the portable electronic device to define an insertion angle of the case 10 when the case 10 is inserted into the portable electronic device, and to prevent the battery module 1 from rotating relative to the portable electronic device.

Figure 3:
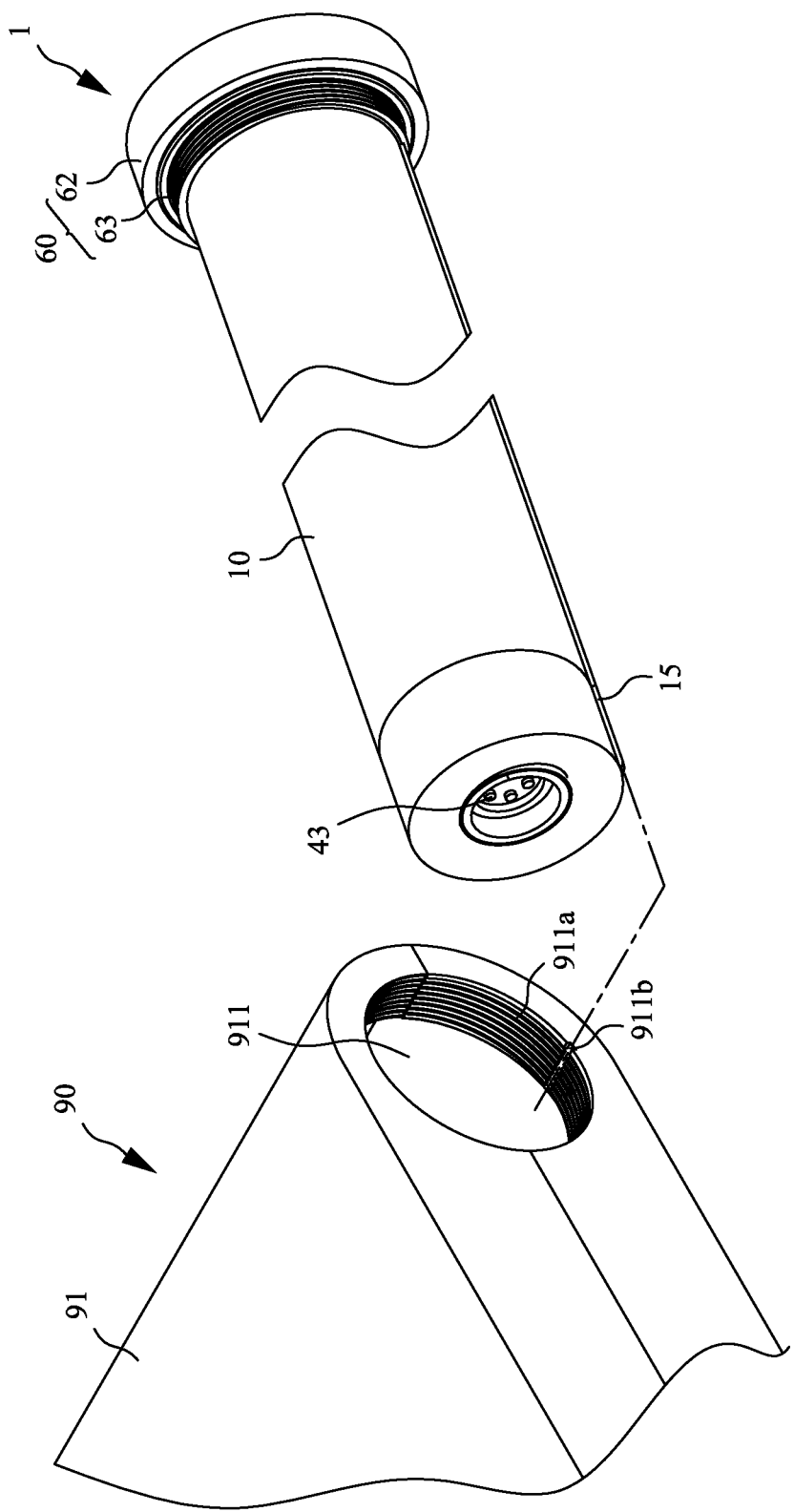
FIG. 3 illustrates a view of the battery module before it is inserted into the portable electronic device.
Figure 4:
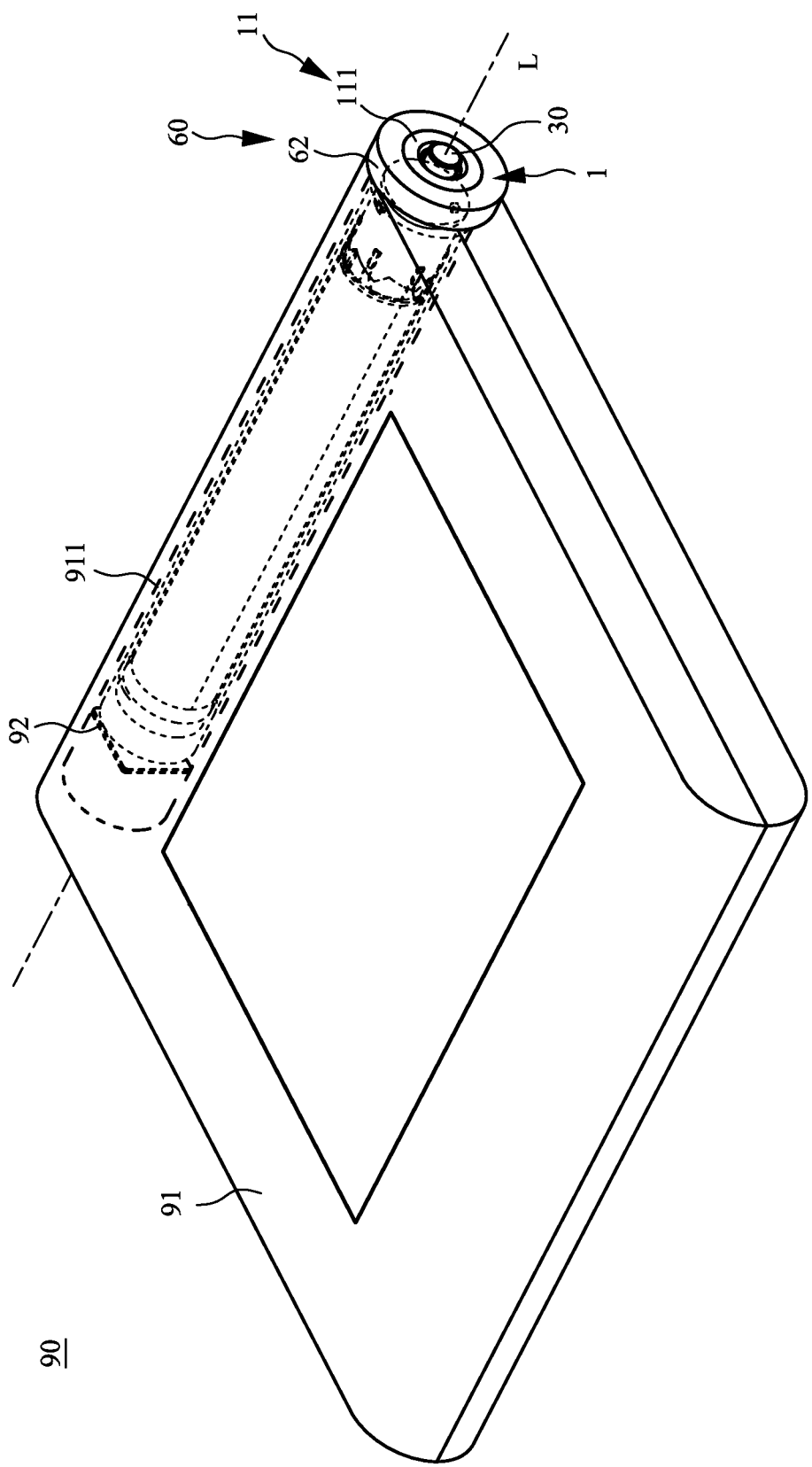
FIG. 4 illustrates a view of the battery module after it is inserted into the portable electronic device.

Please refer to both FIG. 3 and FIG. 4. FIG. 3 illustrates a view of the battery module 1 before it is inserted into the portable electronic device 90; FIG. 4 illustrates a view of the battery module 1 after it is inserted into the portable electronic device 90.

As showing FIG. 3 and FIG. 4, in one embodiment of the present invention, the portable electronic device 90 can be a portable computer (such as a tablet PC or a notebook PC), a personal data assistant, or other electronics devices having the similar structural designs.

The portable electronic device 90 comprises a device body 91, which includes a receiving pit 911 for disposing the battery module 1 and containing most of the case 10 of the battery module 1 therein. The exposed portion 62 of the battery module 1, the first fixing portion 111 of the case 10, and one end of the press element 30 are disposed outside of the receiving pit 911. A power receiving portion 92 is disposed in the receiving pit 911. The power receiving portion 92 is electrically connected with the power connecting portion 43 of the battery module 1 to receive power from the battery module 1 and to supply power to the portable electronic device 90.

Besides, the receiving pit 911 further comprises at least one corresponding guiding portion 911b. Each guiding portion 911b corresponds to each guiding portion 15 of the case 10 to help the user to insert the battery module 1 into the receiving pit 911 of the portable electronic device 90 correctly, so as to avoid the risk of wrong electrical connections, and to prevent the battery module 1 from rotating relative to the device body 91. In this embodiment, each guiding portion 15 can be a guiding column structure, and each corresponding guiding portion 911b can be a guiding groove, and vice versa.

Figure 6:
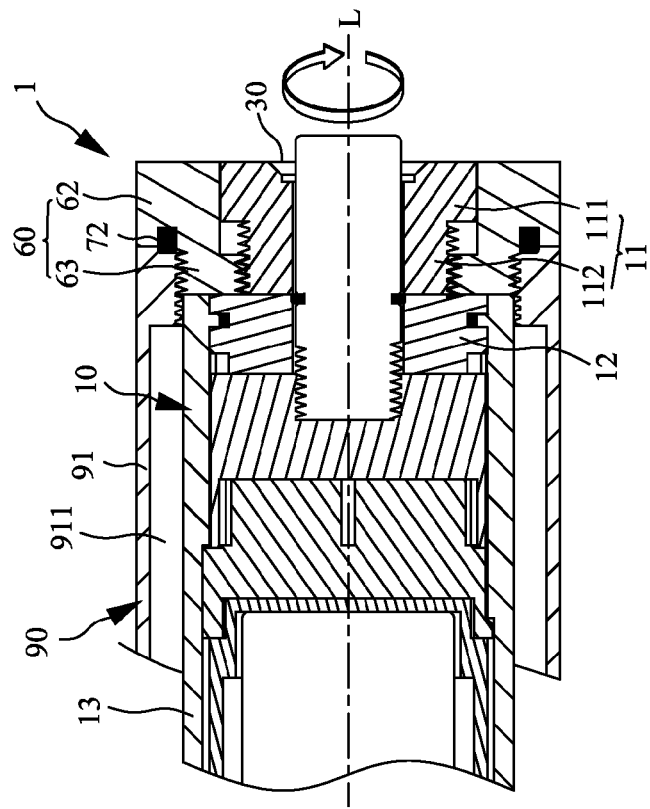
FIG. 6 illustrates a view of the battery module being fixed to the device body of the portable electronic device by a cap.
Figure 5:
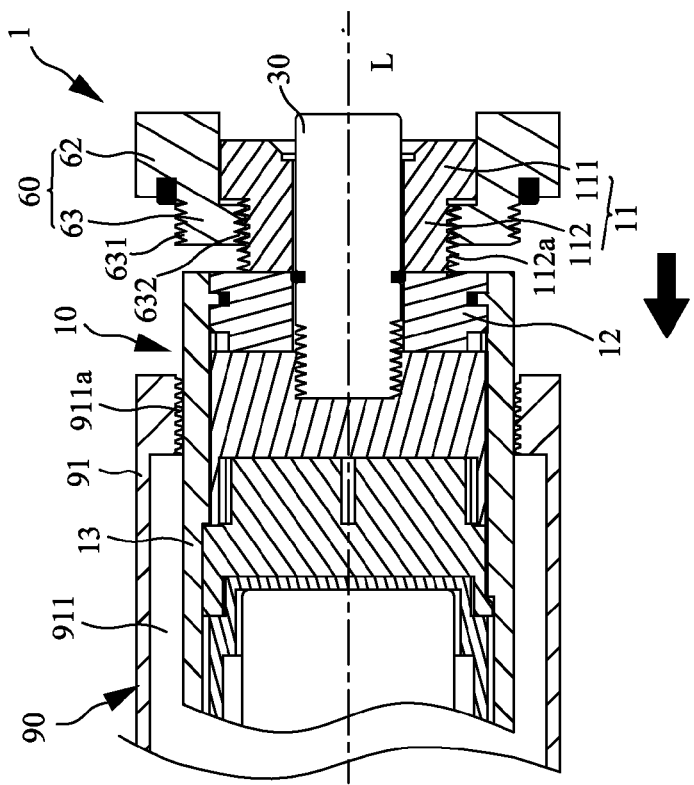
FIG. 5 illustrates a view of a process of the battery module inserting into the receiving pit of the portable electronic device.

Please refer both FIG. 5 and FIG. 6. FIG. 5 illustrates a view of a process of the battery module 1 inserting into the receiving pit 911 of the portable electronic device 90; FIG. 6 illustrates a view of the battery module 1 being fixed to the device body 91 of the portable electronic device 90 by a cap 60.

As shown in FIG. 5, the user first rotates the cap 60 of the battery module 1 around the first axis L relative to the fixing portion 11 of the case 10 and moves the cap 60 in the direction opposite to the arrow with the aid of the screw thread, so that the embedded portion 63 of the cap 60 approaches the first fixing portion 111. Then the user pushes the battery module 1 into the receiving pit 911 of the body 91 of the portable electronic device 90 along the direction of the arrow. Since a cross-sectional diameter of the case 10 of the battery module 1 is not larger than that of the receiving pit 911, the case 10 of the battery module 1 can be inserted into the receiving pit 911 until the embedded portion 63 of the cap 60 reaches the receiving pit 911.

As shown in FIG. 5 and FIG. 6, by the external thread structure 631 of the embedded portion 63 of the cap 60 cooperates with the corresponding thread structure 911a in the receiving pit 911, the embedded portion 63 of the cap 60 is screwed into the receiving pit 911 along the direction of arrow in FIG. 5; the embedded portion 63 of the cap 60 would proceed until the exposed portion 62 of the cap 60 leans against the device body 91 of the portable electronic device 90. During the process, the inner thread structure 632 of the embedded portion 63 also cooperates with the thread structure 112a of the second fixing portion 112 to let the cap 60 move smoothly along the direction of arrow in FIG. 5.

As shown in FIG. 6, when the exposed portion 62 of the cap 60 leans against the device body 91 of the portable electronic device 90, the battery module 1 is fully inserted in the portable electronic device 90; at this time the second elastic isolation element 72 disposed on the exposed portion 62 of the cap 60 is contacted with the device body 91 of the portable electronic device 90 to ensure dust/water-proof therebetween.

Figure 7:
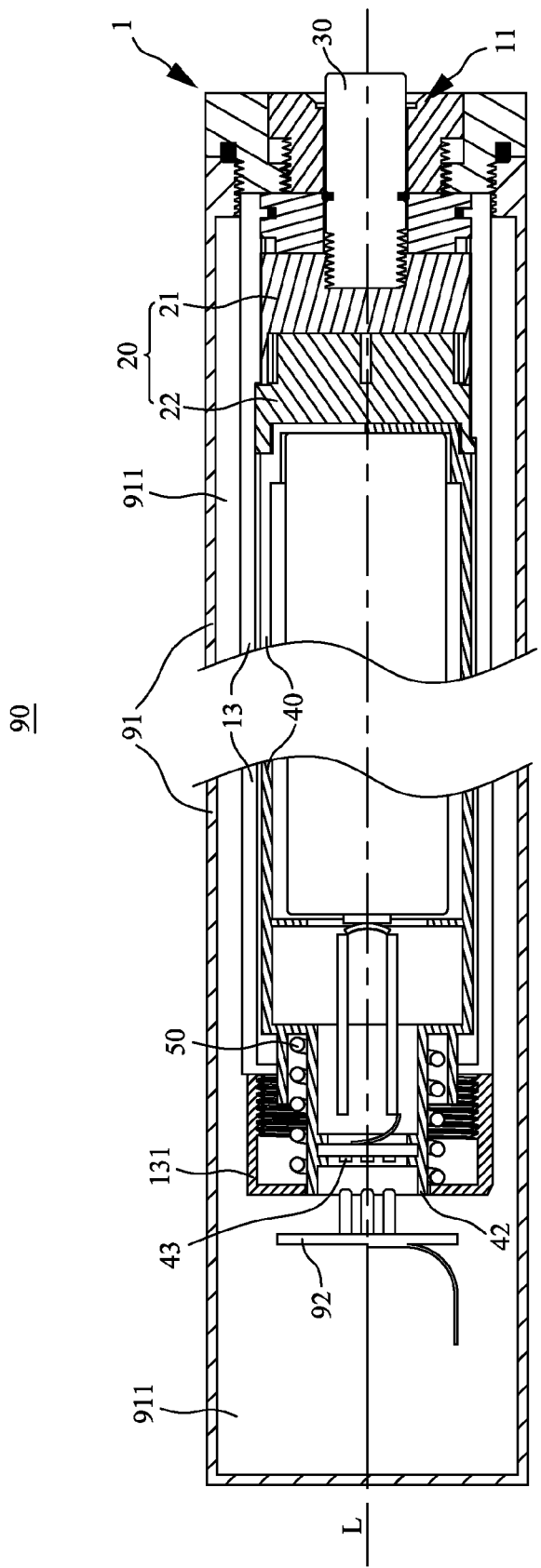
FIG. 7 illustrates a view of the battery module being not electrically connected with the portable electronic device.
Figure 8:
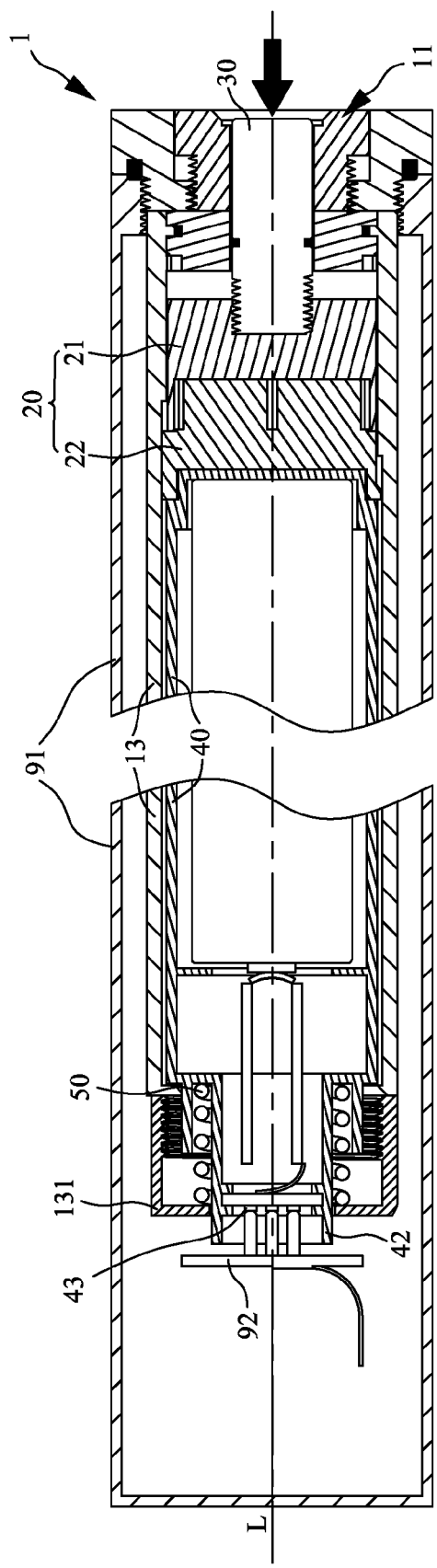
FIG. 8 illustrates a view of the battery module being electrically connected with the portable electronic device.

Please refer to FIG. 7 and FIG. 8. FIG. 7 illustrates a view of the battery module 1 being not electrically connected with the portable electronic device 90; FIG. 8 illustrates a view of the battery module 1 being electrically connected with the portable electronic device 90.

As shown in FIG. 7, when the battery module 1 is fixed to the device body 91 of the portable electronic device 90, the battery module 1 is merely inserted in the receiving pit 911 of the body 91 and is not electrically connected with the portable electronic device 90. At this time the battery body 40 is kept at the initial position, and the press element 30 of the battery module 1 exposes and protruded out of the fixing portion 11 of the case 10.

As shown in FIG. 8, when the user applies a force to push the press element 30 of the battery module 1 along the direction of arrow, the press element 30 drives the extension/retraction positioning module 20 along the first axis L to perform an extension/retraction operation relative to the case 10. At this time the first active element 21 and the second active element 22 move with the corresponding active structure (not shown) on the inner surface of the case 10 to be mutually linked with each other, so that the battery body 40 moves with the extension/retraction positioning module 20 from the initial position in FIG. 7 to the power supply position in FIG. 8. At the power supply position, the elastic element 50 is compressed by the battery body 40 moving in the direction of arrow, and the second end 42 of the battery body 40 protrudes out of the case 10 to let the power connecting portion 43 of the second end 42 be in contact with the power receiving portion 92 in the receiving pit 911 to form electrical connection therebetween. Accordingly, the battery module 1 can supply power to the portable electronic device 90.

Reversely, when the user applies a force again to push the press element 30 in the direction of arrow, the press element 30 also drives the extension/retraction positioning module 20 to perform another extension/retraction operation. At this time the first active element 21 and the second active element 22 move with the corresponding active structure on the inner surface of the case 10 to separate with each other; meanwhile the compressed elastic element 50 generates an elastic restoring force to drive the battery body 40, the extension/retraction positioning module 20 and the press element 30 to move in the direction opposite to the arrow relative to the case 10 from the power supply position in FIG. 8 to the initial position in FIG. 7. Since the power connecting portion 43 is separated from the power receiving portion 92, the battery module 1 and the portable electronic device 90 are not electrically connected at this moment.

Also showing in FIG. 4, the portable electronic device 90 comprises a device body 91, a power receiving portion 92, and the battery module 1. The body 91 comprises a receiving pit 911 for the battery module 1 to be detachably inserted therein. The power receiving portion 92 is disposed in the receiving pit 911 and is used for electrically connecting with the battery module 1. When the battery module 1 is inserted and kept in the receiving pit 911, the battery module 1 can be controlled to determine whether the battery module 1 is or not electrically connected with the portable electronic device 90 by performing the extension/retraction operation of the battery module 1.

Figure 9:
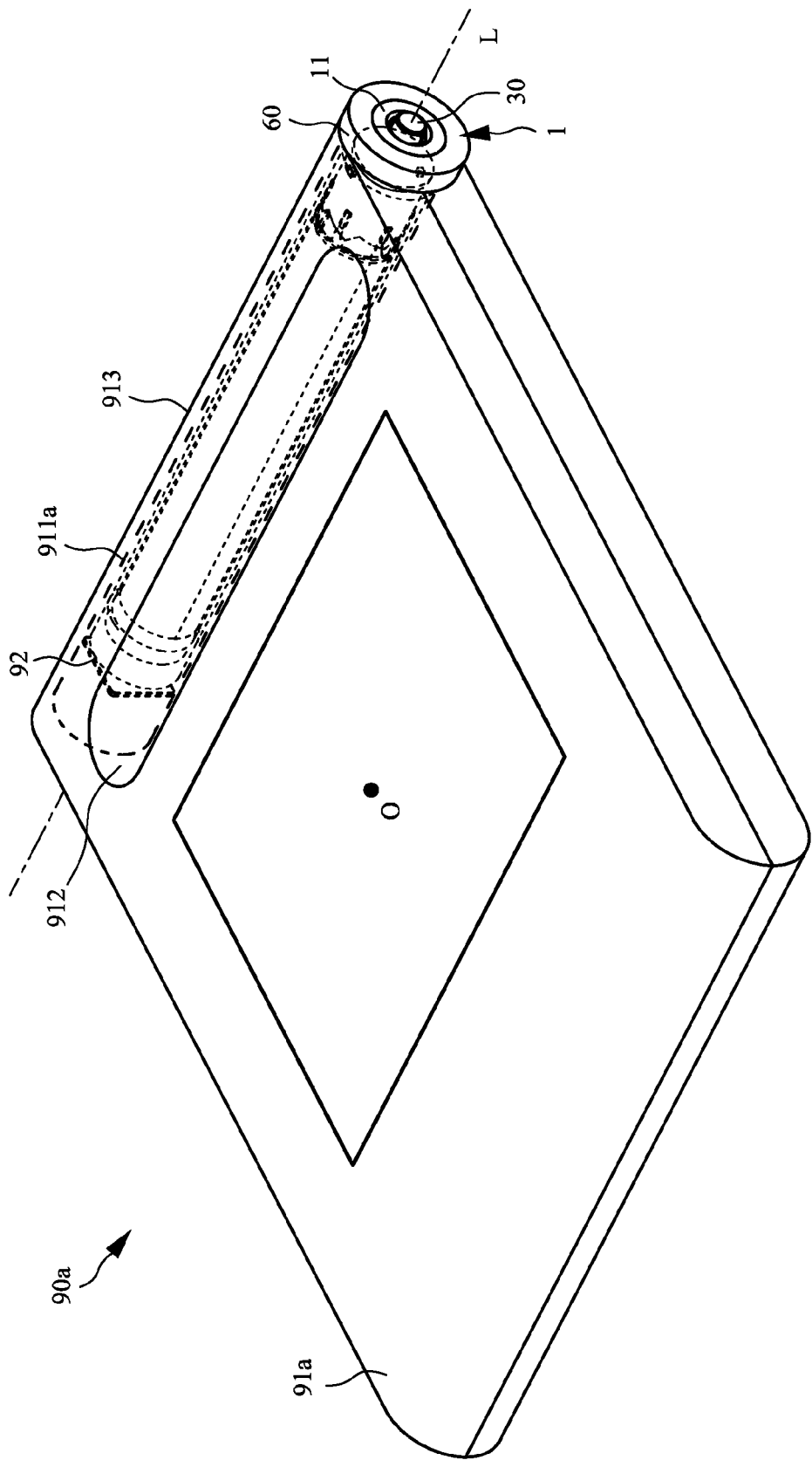
FIG. 9 illustrates a view of the portable electronic device in another embodiment of the present invention.

Please refer to FIG. 9 for a view of the portable electronic device 90a in another embodiment of the present invention.

In this embodiment, the device body 91a further comprises a holding hole 912 disposed at a position deviating from a center O of the device body 91a, so as to form a handle portion 913 between the holding hole 912 and one side of the device body 91a for the user to hold and carry. The receiving pit 911 for inserting the battery module 1 is disposed at the handle portion 913. Since a traditional portable electronic device provides a handle for holding only, the inner space of the handle is left unused. Therefore, the portable electronic device 90a is designed to use the inner space of the handle portion 913 to combine with the battery module 1, thereby reducing the inner space needed for device body 91a.

Accordingly, the battery module of the present invention can be inserted into or removed from the portable electronic device directly. It is different from the traditional portable electronic device to dispose the battery module on the bottom of the device, and the present invention simplifies the detaching procedures for the battery module. Since adopting the extension/retraction structure resembling that of a ball point pen, the present invention can control the electrical connection between the battery module and the portable electronic device simply by pushing the press element, and achieve dust/water proof to enhance the convenience and safety in using the battery module.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A battery module for a portable electronic device, the battery module comprising:
   a case;
   an extension/retraction positioning module disposed in the case to enable an extension/retraction operation along a first axis;
   a press element being connected with the extension/retraction positioning module and penetrating through the case, wherein the press element drives the extension/retraction positioning module to perform the extension/retraction operation when the press element is pushed;
   a battery body disposed in the case to move relative to the case to an initial position or a power supply position by means of the extension/retraction operation, wherein the battery body comprises:
      a first end connected with the extension/retraction positioning module;
      a second end opposite to the first end; and
      a power connecting portion disposed at the second end;
   an elastic element comprising two ends connected with the battery body and the case respectively; and
   a cap combined with the case and the portable electronic device in a rotational manner;
   wherein when the battery body is at the initial position, the battery body is not electrically connected with the portable electronic device; when the battery body moves to the power supply position by means of the extension/retraction operation, the power connecting portion is electrically connected with the portable electronic device.

2. The battery module as claimed in claim 1, further comprises a first elastic isolation element, and the press element comprises a first ring-shaped recess for fixing the first elastic isolation element.

3. The battery module as claimed in claim 1, wherein the case comprises a fixing portion and a through hole penetrating through the fixing portion along the first axis, the cap comprises a shaft hole, the fixing portion of the case to going through the shaft hole, and the press element penetrates through the fixing portion via the through hole.

4. The battery module as claimed in claim 3, wherein the cap further comprises an embedded portion and an exposed portion, the embedded portion and the exposed portion are both hollow cylindrical structures centered around the first axis, the exposed portion having an outer diameter larger than that of the embedded portion; the shaft hole comprises a first shaft hole disposed at the exposed portion and a second shaft hole disposed at the embedded portion, the first shaft hole having a diameter larger than that of the second shaft hole; the embedded portion comprises an external thread structure disposed at an outer surface of the embedded portion and an inner thread structure disposed at an inner surface of the embedded portion facing the second shaft hole.

5. The battery module as claimed in claim 4, wherein the fixing portion comprises a first fixing portion and a second fixing portion, the first fixing portion and the second fixing portion are both hollow cylindrical structures centered around the first axis, the first fixing portion having a outer diameter larger than that of the second fixing portion, the outer diameter of the first fixing portion corresponding to the diameter of the first shaft hole of the cap, and the outer diameter of the second fixing portion corresponding to the diameter of the second shaft hole of the cap; an outer surface of the second fixing portion comprises a thread structure corresponding to the inner thread structure.

6. The battery module as claimed in claim 4, further comprises a second elastic isolation element, and the exposed portion comprises a second ring-shaped recess for fixing the second elastic isolation element.

7. The battery module as claimed in claim 3, further comprises a third elastic isolation element, and the case further comprises an extended portion and a connecting portion; the connecting portion is connected with the extended portion and the fixing portion respectively, and the through hole penetrates through the connecting portion and the fixing portion; the extended portion comprises a ring-shaped protruding portion, the connecting portion comprises a third ring-shaped recess corresponding to the ring-shaped protruding portion, and the third elastic isolation element is disposed between the third ring-shaped recess and the ring-shaped protruding portion.

8. The battery module as claimed in claim 7, wherein the extended portion further comprises at least one restraining structure, and the connecting portion further comprises at least one corresponding restraining structure, the at least one restraining structure corresponding to the corresponding restraining structure to limit the extended portion to rotate relative to the connecting portion.

9. The battery module as claimed in claim 1, wherein the case comprises at least one guiding portion to limit an insertion angle of the case when the case is combined with the portable electronic device.

10. The battery module as claimed in claim 1, wherein the cap can be rotated along the first axis relative to the case and the portable electronic device.

11. The battery module as claimed in claim 1, when the battery body is at the initial position, the power connecting portion of the battery body is in the case; when the battery body is at the power supply position, the power connecting portion protrudes through the case to be electrically connected with the portable electronic device.

12. The battery module as claimed in claim 1, wherein the extension/retraction positioning module comprises a first active element and a second active element, and a corresponding active structure is disposed on the inner surface of the case and at a position corresponding to that of the extension/retraction positioning module; the first active element moves relative to the case along the first axis to push the second active element; the second active element comprises a plurality of locking portions, the second active element can be rotated along the first axis relative to the case when the second active element is pushed by the first active element, thereby enabling the extension/retraction operation when the plurality of locking portions is working with the corresponding active structure.

13. The battery module as claimed in claim 1, wherein the case comprises an extended portion having an opening end, two ends of the elastic element are connected with the second end of the battery body and the opening end of the extended portion of the case respectively, so that the elastic element provides an elastic force along the first axis.

14. A portable electronic device comprising:
   a device body comprising a receiving pit;
   a power receiving portion combined with the receiving pit;
   a battery module detachably inserted in the receiving pit, the battery module comprising:
      a case;
      an extension/retraction positioning module disposed in the case to enable an extension/retraction operation along a first axis;
      a press element being connected with the extension/retraction positioning module and penetrating through the case, wherein the press element drives the extension/retraction positioning module to perform the extension/retraction operation when the press element is pushed;
      a battery body disposed in the case to move relative to the case to an initial position or a power supply position by means of the extension/retraction operation, wherein the battery body comprises:
         a first end connected with the extension/retraction positioning module;
         a second end opposite to the first end; and
         a power connecting portion disposed at the second end;
      an elastic element comprising two ends connected with the battery body and the case respectively; and
      a cap combined with the case and the portable electronic device in a rotational manner;
   wherein when the battery body is at the initial position, the battery body is not electrically connected with the power receiving portion; when the battery body moves to the power supply position by means of the extension/retraction operation, the power connecting portion is electrically connected with the power receiving portion.

15. The portable electronic device as claimed in claim 14, further comprises a first elastic isolation element and a second elastic isolation element; the press element comprises a first ring-shaped recess for fixing the first elastic isolation element and a second ring-shaped recess for fixing the second elastic isolation element.

16. The portable electronic device as claimed in claim 14, wherein the case comprises a fixing portion and a through hole penetrating through the fixing portion along the first axis, the cap comprises a shaft hole for the fixing portion of the case to go through the shaft hole, and the press element penetrates through the fixing portion via the through hole.

17. The portable electronic device as claimed in claim 16, wherein the cap further comprises an embedded portion and an exposed portion, the embedded portion and the exposed portion are both hollow cylindrical structures centered around the first axis, the exposed portion having an outer diameter larger than that of the embedded portion; the shaft hole comprises a first shaft hole disposed at the exposed portion and a second shaft hole disposed at the embedded portion, the first shaft hole having a diameter larger than that of the second shaft hole; the embedded portion comprises an external thread structure disposed at an outer surface of the embedded portion and an inner thread structure disposed at an inner surface of the embedded portion facing the second shaft hole.

18. The portable electronic device as claimed in claim 17, wherein the fixing portion comprises a first fixing portion and a second fixing portion, the first fixing portion and the second fixing portion are both hollow cylindrical structures centered around the first axis, the first fixing portion having a outer diameter larger than that of the second fixing portion, the outer diameter of the first fixing portion corresponding to the diameter of the first shaft hole of the cap, and the outer diameter of the second fixing portion corresponding to the diameter of the second shaft hole of the cap; an outer surface of the second fixing portion comprises a thread structure corresponding to the inner thread structure.

19. The portable electronic device as claimed in claim 16, further comprises a third elastic isolation element, and the case further comprises an extended portion and a connecting portion; the connecting portion is connected with the extended portion and the fixing portion respectively, and the through hole penetrates through the connecting portion and the fixing portion; the extended portion comprises a ring-shaped protruding portion, the connecting portion comprises a third ring-shaped recess corresponding to the ring-shaped protruding portion, and the third elastic isolation element is disposed between the third ring-shaped recess and the ring-shaped protruding portion.

20. The portable electronic device as claimed in claim 14, wherein the device body further comprises a holding hole disposed at an off-center position to form a handle portion between the holding hole and one side of the device body; and the receiving pit is disposed at the handle portion.

* * * * *